United States Patent
Ikeuchi et al.

(10) Patent No.: US 11,706,988 B2
(45) Date of Patent: Jul. 18, 2023

(54) PIEZOELECTRIC DEVICE AND METHOD OF MANUFACTURING THE SAME

(71) Applicant: Murata Manufacturing Co., Ltd., Nagaokakyo (JP)

(72) Inventors: Shinsuke Ikeuchi, Nagaokakyo (JP); Tetsuya Kimura, Nagaokakyo (JP); Katsumi Fujimoto, Nagaokakyo (JP); Yutaka Kishimoto, Nagaokakyo (JP); Fumiya Kurokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 636 days.

(21) Appl. No.: 16/777,926

(22) Filed: Jan. 31, 2020

(65) Prior Publication Data
US 2020/0168787 A1   May 28, 2020

Related U.S. Application Data

(63) Continuation of application No. PCT/JP2018/042571, filed on Nov. 16, 2018.

(30) Foreign Application Priority Data

Nov. 22, 2017 (JP) .................. 2017-224671

(51) Int. Cl.
*H01L 41/09* (2006.01)
*H10N 30/20* (2023.01)
(Continued)

(52) U.S. Cl.
CPC ........... *H10N 30/20* (2023.02); *H10N 30/045* (2023.02); *H10N 30/1051* (2023.02);
(Continued)

(58) Field of Classification Search
CPC . H01L 41/09; H01L 41/0471; H01L 41/0533; H01L 41/0805; H01L 41/083;
(Continued)

(56) References Cited

U.S. PATENT DOCUMENTS

2005/0242687 A1   11/2005   Kawakubo et al.
2006/0202769 A1*  9/2006    Nagao ............... H03H 3/02
                                                 331/73
(Continued)

FOREIGN PATENT DOCUMENTS

CN   101689841 A   3/2010
CN   105659495 A   6/2016
(Continued)

OTHER PUBLICATIONS

Official Communication issued in corresponding Japanese Patent Application No. 2020-080315, dated Feb. 18, 2021.
(Continued)

*Primary Examiner* — Jarrett J Stark
(74) *Attorney, Agent, or Firm* — Keating & Bennett, LLP

(57) ABSTRACT

A piezoelectric device includes a piezoelectric single crystal body with a homogeneous polarization state and of which at least a portion flexurally vibrates, an upper electrode on an upper surface of the piezoelectric single crystal body, a lower electrode on a lower surface of the piezoelectric single crystal body, and a supporting substrate below the piezoelectric single crystal body. A recess extends from a lower surface of the supporting substrate toward the lower surface of the piezoelectric single crystal body.

11 Claims, 21 Drawing Sheets

(51) Int. Cl.
  *H10N 30/045* (2023.01)
  *H10N 30/50* (2023.01)
  *H10N 30/87* (2023.01)
  *H10N 30/88* (2023.01)
  *H10N 30/00* (2023.01)

(52) U.S. Cl.
  CPC ........... *H10N 30/50* (2023.02); *H10N 30/871* (2023.02); *H10N 30/883* (2023.02)

(58) Field of Classification Search
  CPC . H01L 41/257; H01L 41/0973; H01L 41/313; H01L 41/0933; H03H 9/02433; H03H 9/2405; H03H 2009/0248; H03H 2009/02488; H03H 2009/2442; H03H 3/0072
  See application file for complete search history.

(56) References Cited

U.S. PATENT DOCUMENTS

| | | | |
|---|---|---|---|
| 2007/0108876 A1 | 5/2007 | Ogawa | |
| 2007/0194225 A1* | 8/2007 | Zorn | G01Q 30/10 250/306 |
| 2007/0227333 A1 | 10/2007 | Higuchi et al. | |
| 2010/0088868 A1 | 4/2010 | Kando et al. | |
| 2010/0157000 A1* | 6/2010 | Sumi | B41J 2/14233 310/330 |
| 2012/0176002 A1* | 7/2012 | Kim | H04R 3/04 310/317 |
| 2013/0229465 A1* | 9/2013 | Fujii | H01L 41/316 29/25.35 |
| 2016/0156332 A1 | 6/2016 | Umeda | |
| 2016/0240768 A1* | 8/2016 | Fujii | H01L 41/0471 |
| 2018/0069168 A1 | 3/2018 | Ikeuchi et al. | |
| 2018/0123018 A1 | 5/2018 | Ueda et al. | |
| 2018/0351075 A1 | 12/2018 | Sawaki et al. | |
| 2019/0245515 A1* | 8/2019 | Hurwitz | H03H 9/1014 |

FOREIGN PATENT DOCUMENTS

| | | | | |
|---|---|---|---|---|
| DE | 19521148 A1 | * | 12/1996 | ........... H01L 41/257 |
| JP | 07-299909 A | | 11/1995 | |
| JP | 2005191397 A | | 7/2005 | |
| JP | 2005-313276 A | | 11/2005 | |
| JP | 4404218 B2 | | 1/2010 | |
| JP | 2010-143205 A | | 7/2010 | |
| JP | 2016-197717 A | | 11/2016 | |
| JP | 6132022 B2 | | 5/2017 | |
| WO | 2009/081651 A1 | | 7/2009 | |
| WO | 2015/025716 A1 | | 2/2015 | |
| WO | 2015/064423 A1 | | 5/2015 | |
| WO | WO-2016157855 A1 | * | 10/2016 | .......... B41J 2/14274 |
| WO | 2016/175013 A1 | | 11/2016 | |
| WO | 2017/135166 A1 | | 8/2017 | |

OTHER PUBLICATIONS

Office Action in JP2020-080315, dated Sep. 8, 2022, 7 pages.
Official Communication issued in International Patent Application No. PCT/JP2018/042571, dated Jan. 22, 2019.
First Office Action in CN201880059615.8, dated Jan. 6, 2023, 8 pages.
Hosono et al., "High-Efficiency Piezoelectric Single Crystals," Toshiba Review, vol. 59, No. 10, Oct. 2004, pp. 39-42.
Office Action in JP2020-080315, dated Mar. 23, 2023, 9 pages.

* cited by examiner

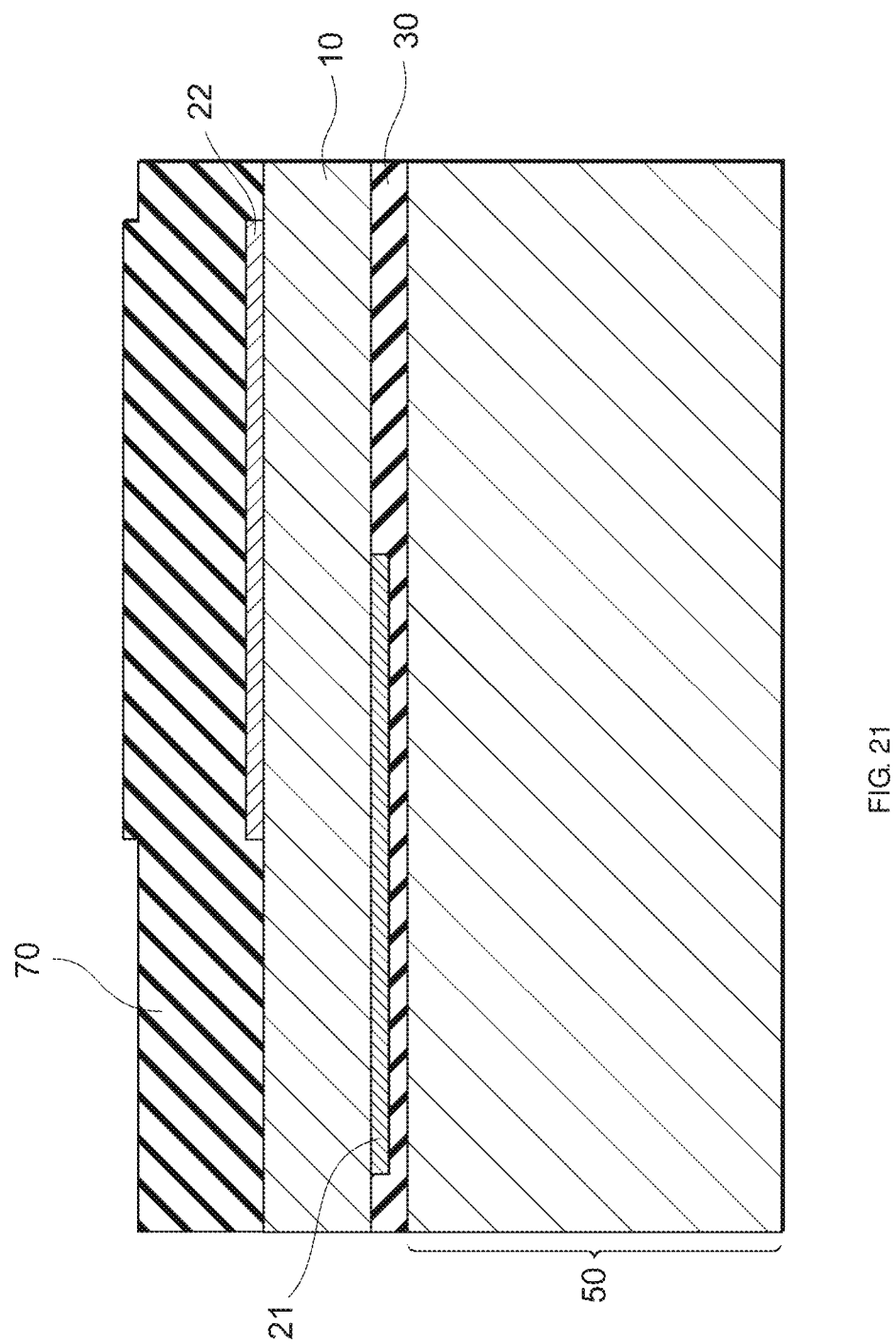

PIEZOELECTRIC DEVICE AND METHOD OF MANUFACTURING THE SAME

CROSS REFERENCE TO RELATED APPLICATIONS

This application claims the benefit of priority to Japanese Patent Application No. 2017-224671 filed on Nov. 22, 2017 and is a Continuation Application of PCT Application No. PCT/JP2018/042571 filed on Nov. 16, 2018. The entire contents of each application are hereby incorporated herein by reference.

BACKGROUND OF THE INVENTION

1. Field of the Invention

The present invention relates to a piezoelectric device and to a method of manufacturing the piezoelectric device.

2. Description of the Related Art

Vibrators having a unimorph structure or a bimorph structure have been developed. The vibrators are used for oscillators for clocks and piezoelectric buzzers. The unimorph structure is a laminated structure formed of a piezoelectric body and of a passive elastic layer or a piezoelectric body to which voltage is not applied. An upper electrode is disposed on the upper surface of a piezoelectric body, and a lower electrode is disposed on the lower surface of the piezoelectric body. When a voltage is applied by the upper and lower electrodes, the piezoelectric body tries to expand or contract in an in-plane direction. However, the passive elastic layer or the piezoelectric body to which voltage is not applied does not expand nor contract. As a result, the unimorph structure flexurally vibrates. The bimorph structure is a laminated structure formed of two layers of piezoelectric bodies. An elastic plate such as a metal plate called a "shim" may be interposed between the two layers of piezoelectric bodies. When a voltage is applied to the two layers of piezoelectric bodies, one of the piezoelectric bodies tries to expand in an in-plane direction and the other piezoelectric body tries to contract in the in-plane direction, which causes the entirety of the two layers of piezoelectric bodies to bend. The piezoelectric bodies are made of, for example, aluminum nitride (AlN) or lead zirconate titanate (PZT) (for example, see Japanese Patent No. 4404218 and Japanese Patent No. 6132022). The piezoelectric bodies may be formed on the lower electrode by using a method, such as vapor evaporation, sputtering, laser ablation, or chemical vapor deposition (CVD).

SUMMARY OF THE INVENTION

Preferred embodiments of the present invention provide reliable piezoelectric devices and methods of manufacturing reliable piezoelectric devices.

According to a preferred embodiment of the present invention, a piezoelectric device includes a piezoelectric single crystal body that has a homogeneous polarization state and of which at least a portion is configured to flexurally vibrate, an upper electrode disposed on an upper surface of the piezoelectric single crystal body, a lower electrode disposed on a lower surface of the piezoelectric single crystal body, and a supporting substrate disposed below the piezoelectric single crystal body. In the piezoelectric device, a recess extends from a lower surface of the supporting substrate toward the lower surface of the piezoelectric single crystal body.

According to another preferred embodiment of the present invention, a method of manufacturing a piezoelectric device of which at least a portion of the piezoelectric single crystal body is configured to flexurally vibrate includes preparing a piezoelectric single crystal body with a homogeneous polarization state, forming a lower electrode on a lower surface of the piezoelectric single crystal body, forming an upper electrode on an upper surface of the piezoelectric single crystal body, disposing a supporting substrate below the piezoelectric single crystal body, and forming a recess that extends from a lower surface of the supporting substrate toward the lower surface of the piezoelectric single crystal body.

According to preferred embodiments of the present invention, reliable piezoelectric devices and methods of manufacturing reliable piezoelectric devices are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 21 is another schematic cross-sectional view for explanation of the method of manufacturing the piezoelectric device according to the third preferred embodiment of the present invention.

DETAILED DESCRIPTION OF THE PREFERRED EMBODIMENTS

Preferred embodiments of the present invention will be described with reference to the drawings. In the following description, the same or similar elements or portions are denoted by the same or similar reference symbols. The drawings provided are only schematic. Accordingly, specific dimensions or the like should be determined in accordance with the description below. Dimensional and proportional relationships between elements or portions may be different in different drawings.

First Preferred Embodiment

Figure 1:
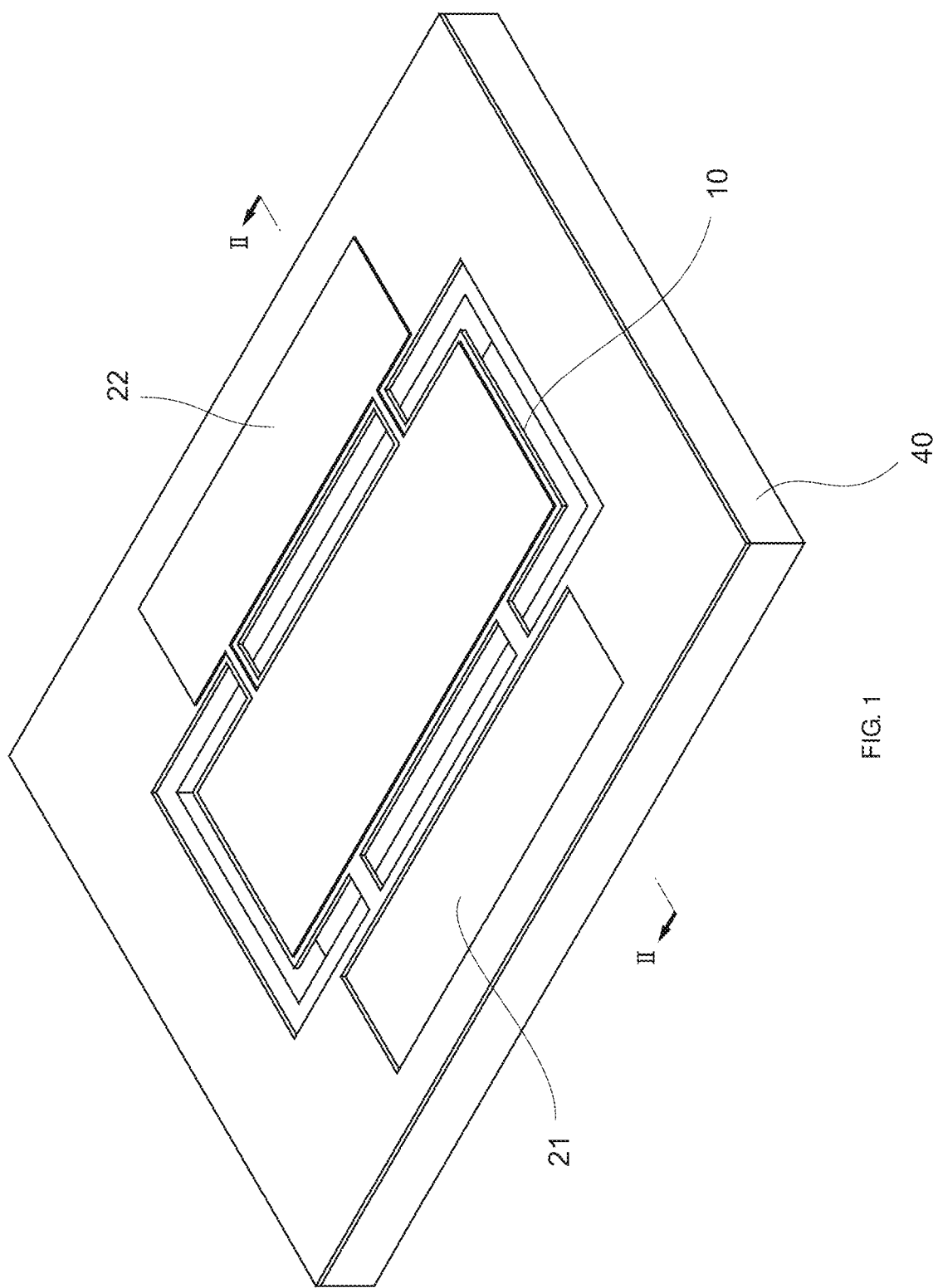
FIG. 1 is a perspective view illustrating a piezoelectric device according to a first preferred embodiment of the present invention as viewed obliquely from above.
Figure 2:
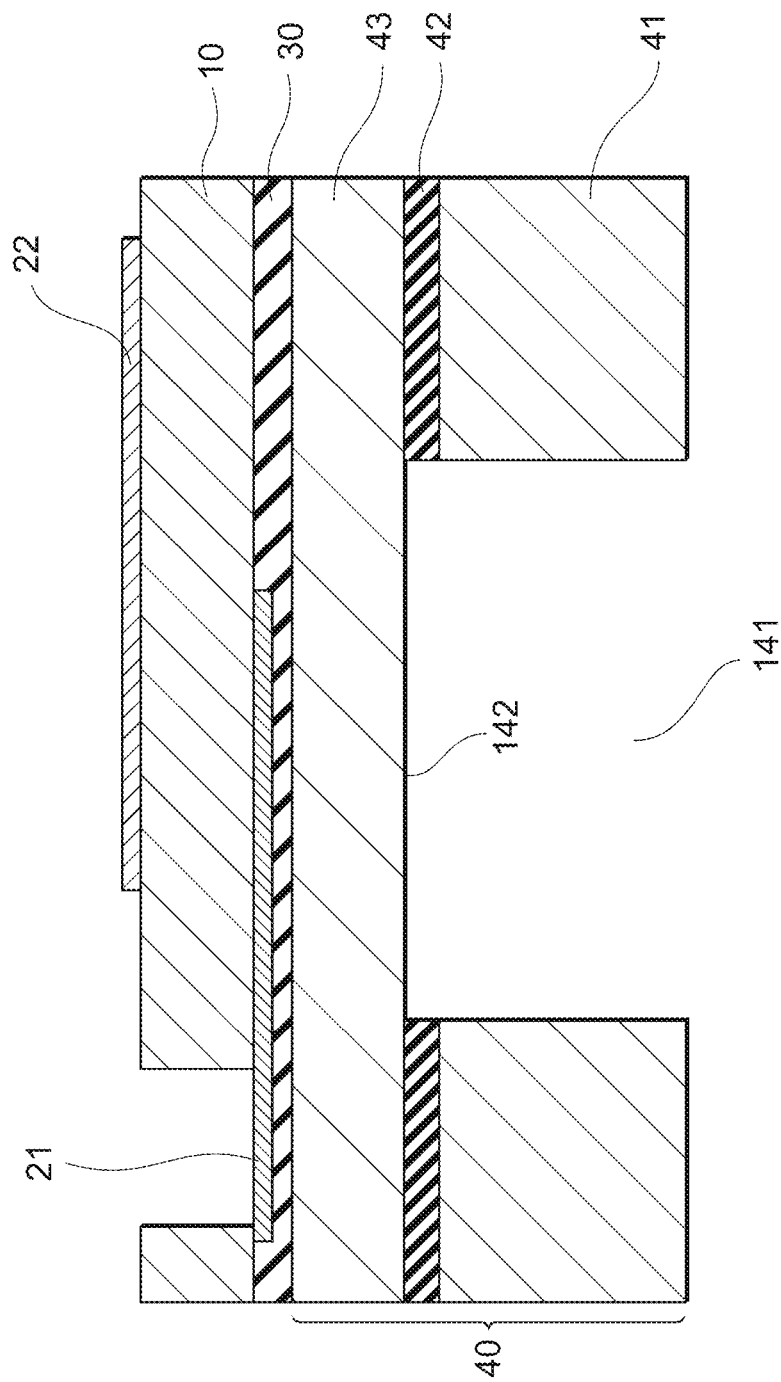
FIG. 2 is a schematic perspective view illustrating the piezoelectric device according to the first preferred embodiment of the present invention, which is cut along II-II in FIG. 1 and viewed in the direction of arrows.
Figure 3:
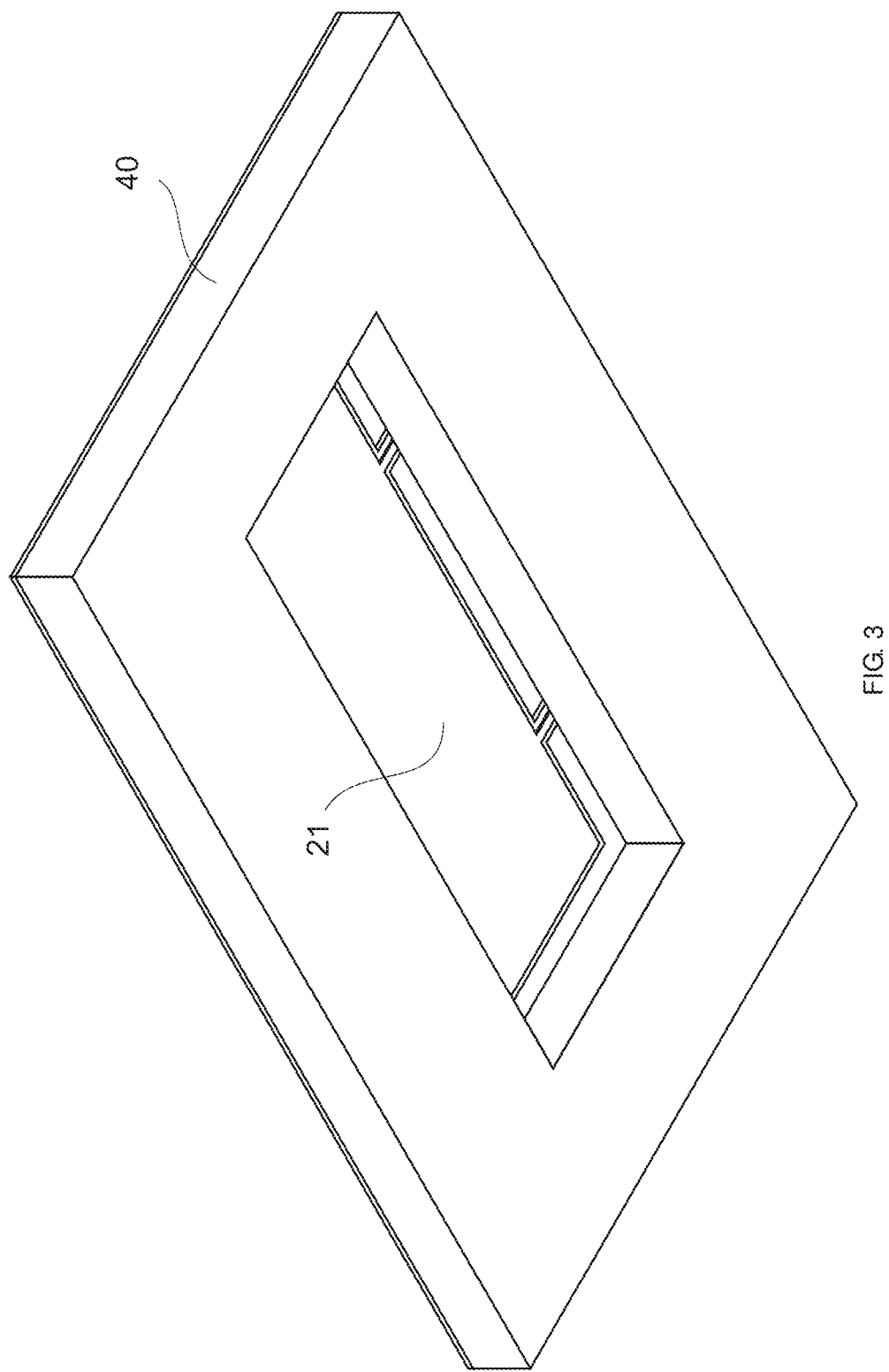
FIG. 3 is a perspective view illustrating the piezoelectric device according to the first preferred embodiment of the present invention as viewed obliquely from below.

FIG. 1 is a perspective view illustrating a piezoelectric device according to a first preferred embodiment of the present invention as viewed obliquely from above. FIG. 2 is a schematic cross-sectional view illustrating the piezoelectric device which is cut along II-II in FIG. 1 and viewed in the direction of arrows, and FIG. 3 is a perspective view illustrating the piezoelectric device as viewed obliquely from below. As illustrated in these figures, the piezoelectric device includes a piezoelectric single crystal body 10, an upper electrode 22, a lower electrode 21, and a supporting substrate 40. The piezoelectric single crystal body 10 is configured such that the polarization state thereof is homogeneous and at least a portion of the piezoelectric single crystal body 10 is able to flexurally vibrate. The upper electrode 22 is disposed at the upper surface of the piezoelectric single crystal body 10, and the lower electrode 21 is disposed at the lower surface thereof. The supporting substrate 40 is disposed below the piezoelectric single crystal body 10. The piezoelectric device includes a recess 141 that extends from a lower surface of the supporting substrate 40 toward a lower surface of the piezoelectric single crystal body 10.

The piezoelectric device according to the first preferred embodiment may further include an amorphous layer 30 disposed on the lower surface of the piezoelectric single crystal body 10 and on the lower surface of the lower electrode 21. The supporting substrate 40 may be disposed on the lower surface of the amorphous layer 30.

The piezoelectric single crystal body 10 is made of a single crystal of, for example, lithium tantalate (LT) or lithium niobate (LN). The piezoelectric single crystal body 10 has a homogeneous quality and also has a homogeneous polarization (orientation) state both in a portion of the piezoelectric single crystal body 10 including the lower electrode 21 and in a portion thereof not including the lower electrode 21. The upper and lower surfaces of the piezoelectric single crystal body 10 are preferably flat and smooth without having a step or a tapered structure except for a portion processed to form electrodes and devices.

The lower electrode 21 and the upper electrode 22 are made of an electroconductive material, such as platinum (Pt) or gold (Au). The lower electrode 21 and the upper electrode 22 are configured to apply voltage to the piezoelectric single crystal body 10. The lower electrode 21 is buried in the amorphous layer 30. The amorphous layer 30 is made of an insulating material, such as silicon oxide. The amorphous layer 30 may be made of a heat-insulating material.

The supporting substrate 40 is a silicon-on-insulator (SOI) based substrate that includes a handle layer 41, a buried oxide film 42 disposed on the handle layer 41, and an active layer 43 disposed on the buried oxide film 42. The upper surface of active layer 43 of the SOI-based substrate and the lower surface of the amorphous layer 30 are joined to each other.

What is exposed from a bottom 142 of a recess 141 may be the buried oxide film 42, the active layer 43, the amorphous layer 30, or the piezoelectric single crystal body 10 and the lower electrode 21.

In the first preferred embodiment, at least a portion of the piezoelectric device where the upper electrode 22, the piezoelectric single crystal body 10, and the lower electrode 21 overlap each other as viewed from above defines and functions as a flexural vibrating diaphragm. When a voltage is applied to the piezoelectric single crystal body 10 between the upper electrode 22 and the lower electrode 21, the piezoelectric single crystal body 10 tries to expand or contract in an in-plane direction while at least the upper electrode 22 or the lower electrode 21 does not expand nor contract. As a result, the flexural vibrating diaphragm flexurally vibrates up and down.

The flexural vibrating diaphragm can further include at least a portion of the amorphous layer 30 depending on the bottom position of the recess 141 in the piezoelectric device. Moreover, the flexural vibrating diaphragm can further include at least a portion of the amorphous layer 30 and at least a portion of the active layer 43. Alternatively, the flexural vibrating diaphragm can further include at least a portion of the amorphous layer 30, at least a portion of the active layer 43, and at least a portion of the oxide film 42.

When the flexural vibrating diaphragm flexurally vibrates, it is preferable that a neutral plane of the flexural vibrating diaphragm be present outside the piezoelectric single crystal body 10.

In the case of the amorphous layer 30 being exposed at the bottom of the recess 141, the thickness of the amorphous layer 30 is preferably set to be such that when the flexural vibrating diaphragm flexurally vibrates, the neutral plane of the flexural vibrating diaphragm is present inside the amorphous layer 30 and outside the piezoelectric single crystal body 10.

In the case of the active layer 43 being exposed at the bottom of the recess 141, the total thickness of the amorphous layer 30 and the active layer 43 is preferably set to be such that when the flexural vibrating diaphragm flexurally vibrates, the neutral plane of the flexural vibrating diaphragm is present inside the amorphous layer 30 or the active layer 43 and outside the piezoelectric single crystal body 10.

In the case of the buried oxide film 42 being exposed at the bottom of the recess 141, the total thickness of the amorphous layer 30, the active layer 43, and the buried oxide film 42 is preferably set to be such that when the flexural vibrating diaphragm flexurally vibrates, the neutral plane of the flexural vibrating diaphragm is present inside the amorphous layer 30, the active layer 43, or the buried oxide film 42 and outside the piezoelectric single crystal body 10.

Next, a method of manufacturing the piezoelectric device according to the first preferred embodiment will be described.

Figure 4:
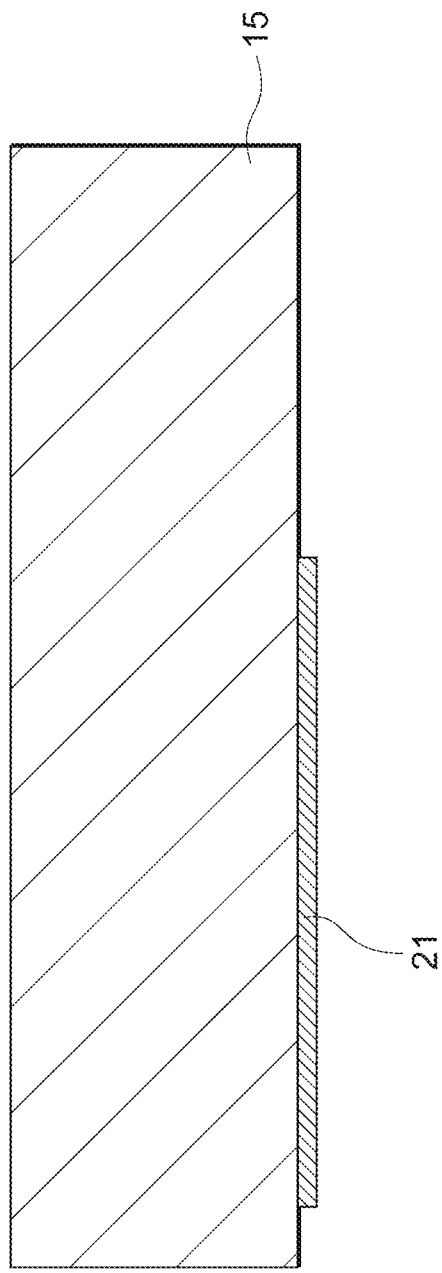
FIG. 4 is a schematic cross-sectional view for explanation of a method of manufacturing the piezoelectric device according to the first preferred embodiment of the present invention.

First, as illustrated in FIG. 4, a piezoelectric single crystal body 15 that is shaped like a substrate and made of, for example, lithium tantalate (LT) or lithium niobate (LN) is prepared. Subsequently, a conductive film made of a conductive material such as platinum (Pt) or gold (Au) is formed on the flat and smooth lower surface of the piezoelectric single crystal body 15. The lower electrode 21 is formed on the lower surface of the piezoelectric single crystal body 15 by patterning the conductive film into a predetermined shape. Note that a contact layer made of a metal, such as titanium (Ti) or chromium (Cr), may be formed first on the lower surface of the piezoelectric single crystal body 15, and subsequently the conductive film may be formed on the contact layer.

Figure 5:
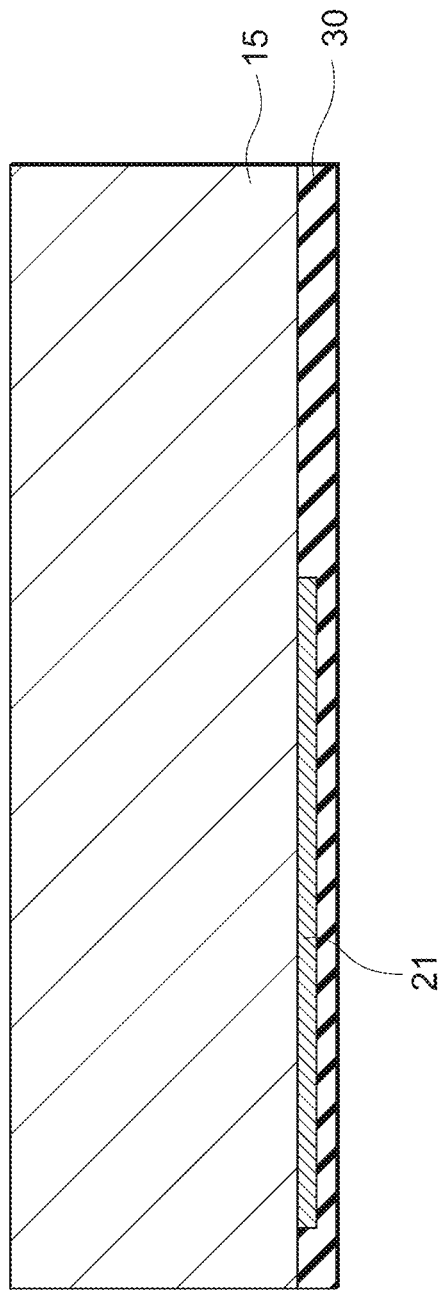
FIG. 5 is another schematic cross-sectional view for explanation of the method of manufacturing the piezoelectric device according to the first preferred embodiment of the present invention.

As illustrated in FIG. 5, the amorphous layer 30 made of, for example, silicon dioxide ($SiO_2$) is provided on the lower surface of the piezoelectric single crystal body 15 and the lower surface of the lower electrode 21. The lower electrode 21 is thus disposed inside the amorphous layer 30. Subsequently, the lower surface of the amorphous layer 30 preferably is subjected to chemomechanical polishing (CMP) to smooth the lower surface.

Figure 6:
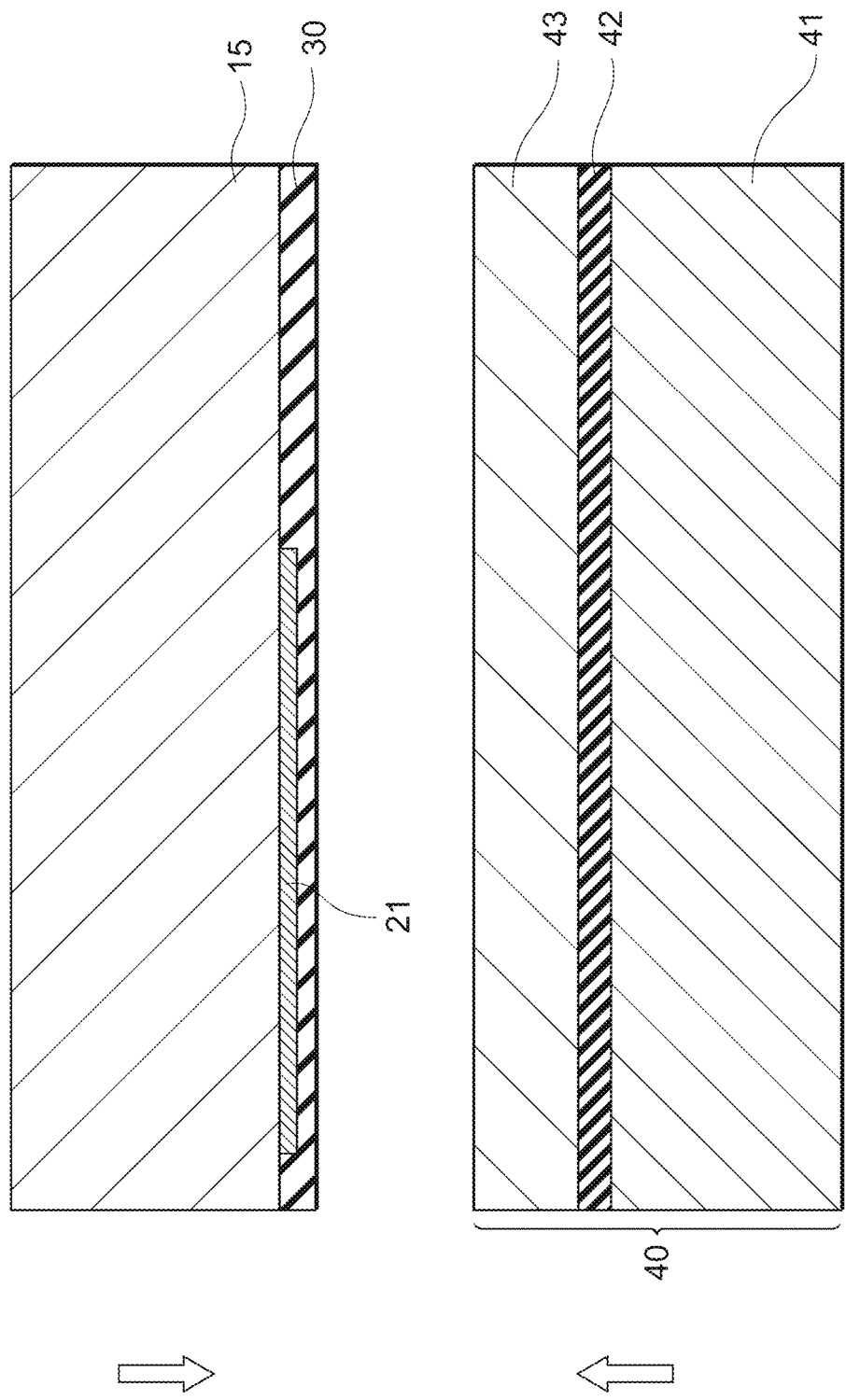
FIG. 6 is another schematic cross-sectional view for explanation of a method of manufacturing the piezoelectric device according to the first preferred embodiment of the present invention.
Figure 7:
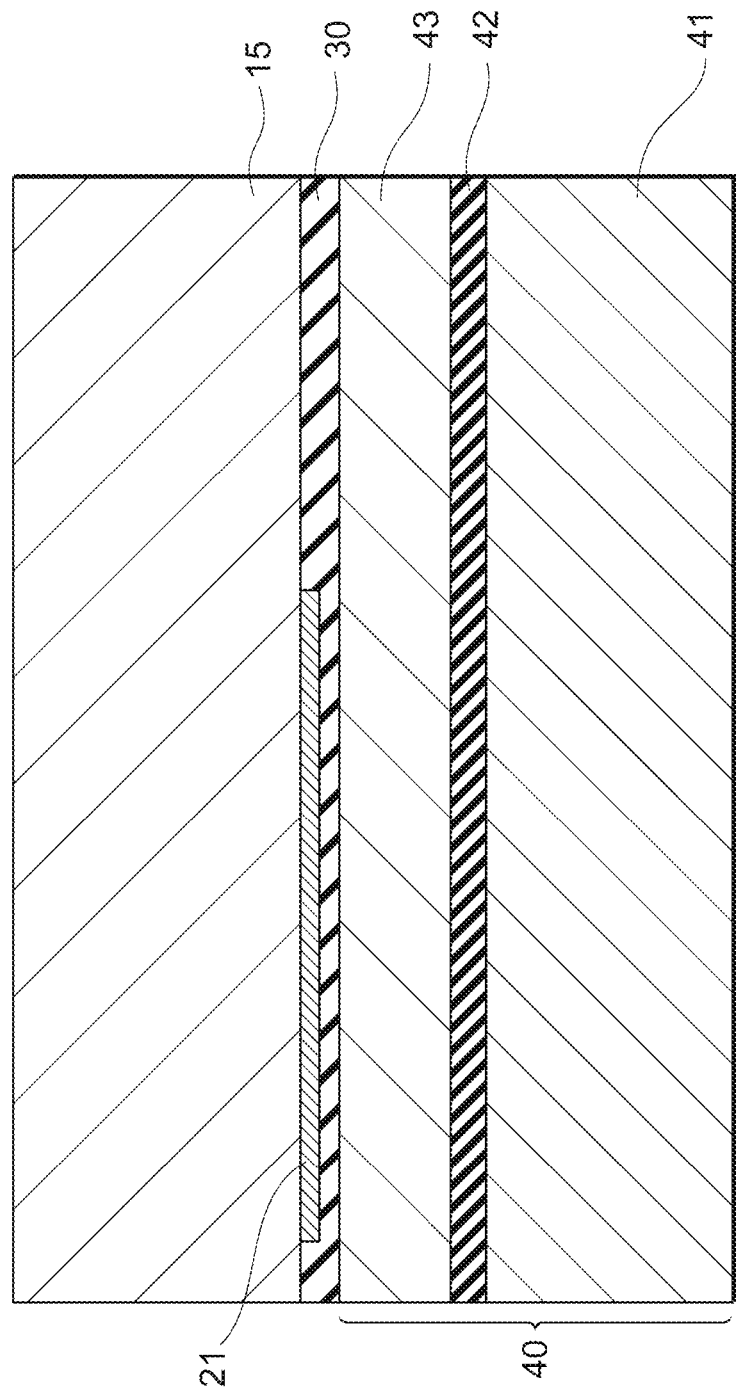
FIG. 7 is another schematic cross-sectional view for explanation of the method of manufacturing the piezoelectric device according to the first preferred embodiment of the present invention.
Figure 8:
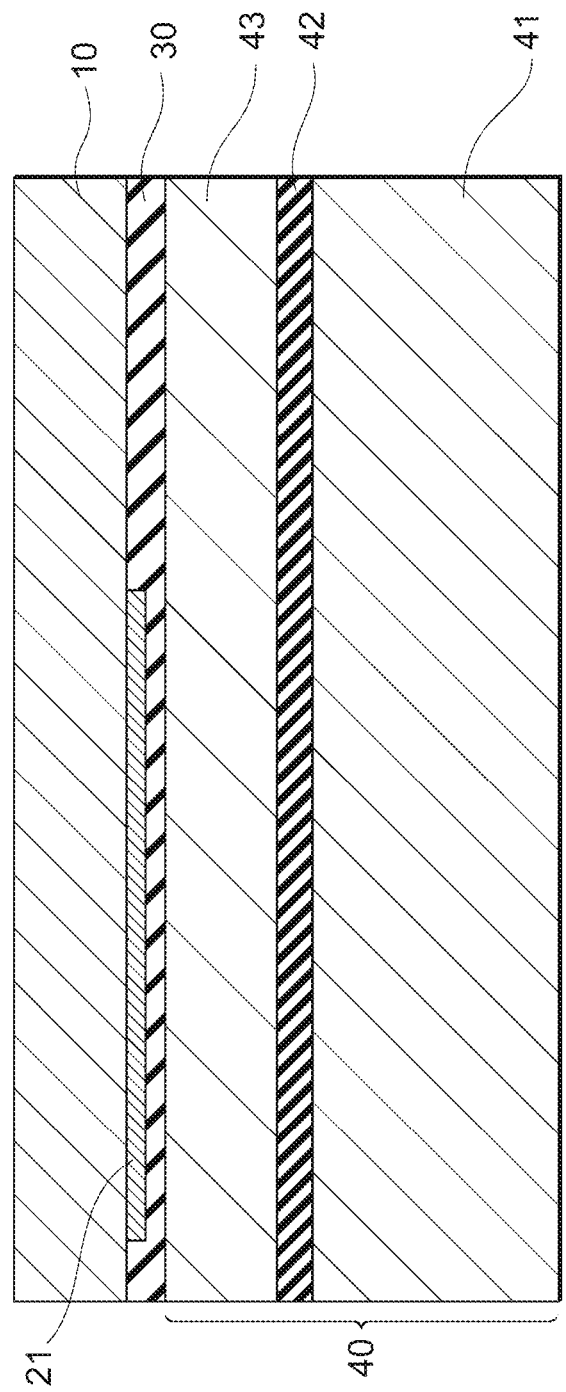
FIG. 8 is another schematic cross-sectional view for explanation of the method of manufacturing the piezoelectric device according to the first preferred embodiment of the present invention.

As illustrated in FIG. 6, an SOI-based substrate is prepared as the supporting substrate 40. The SOI-based substrate includes the handle layer 41, the buried oxide film 42 disposed on the handle layer 41, and the active layer 43 disposed on the buried oxide film 42. Next, as illustrated in FIG. 7, the upper surface of active layer 43 of the SOI-based substrate and the lower surface of the amorphous layer 30 are directly joined to each other. Subsequently, as illustrated in FIG. 8, a film-shaped piezoelectric single crystal body 10 is formed by polishing the substrate-shaped piezoelectric single crystal body 15 from the upper surface thereof so as to reduce the thickness. The thickness of the piezoelectric single crystal body 10 is determined so as to enable desired expansion and contraction to occur when a voltage is applied.

Figure 9:
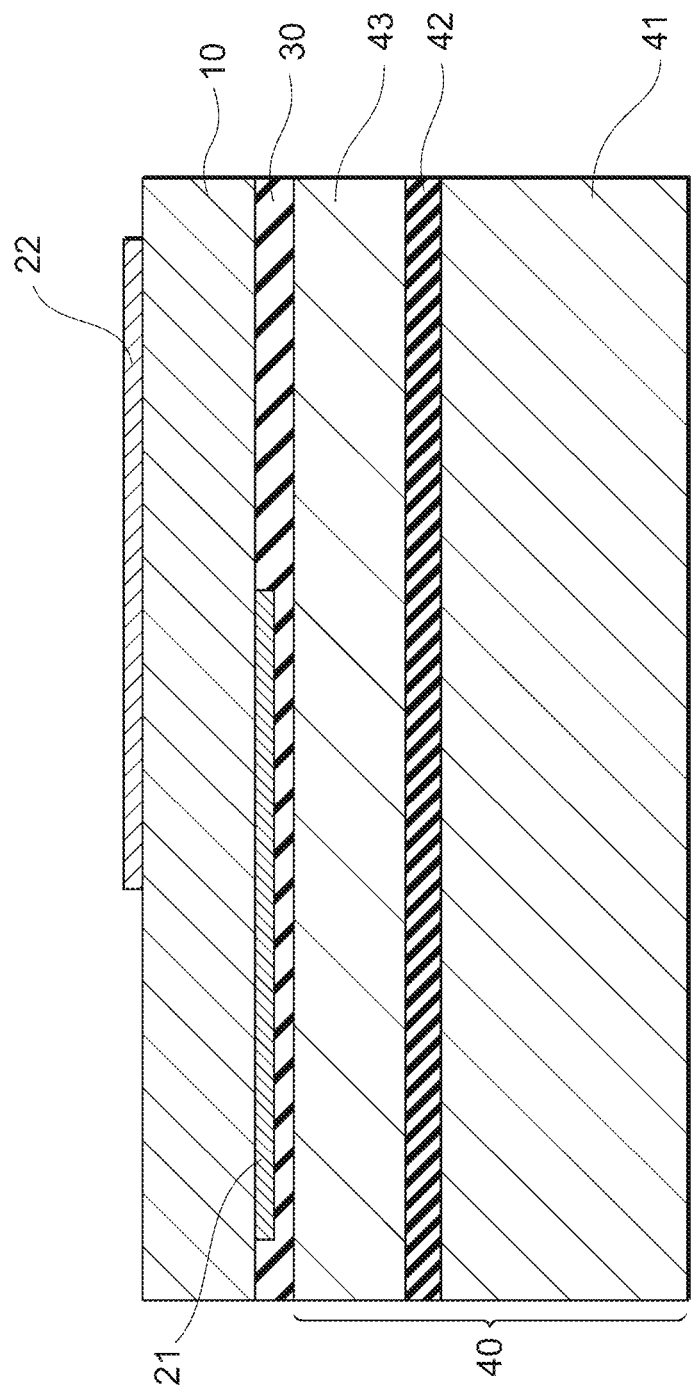
FIG. 9 is another schematic cross-sectional view for explanation of the method of manufacturing the piezoelectric device according to the first preferred embodiment of the present invention.

As illustrated in FIG. 9, the conductive film made of a conductive material such as platinum (Pt) or gold (Au) is formed on the upper surface of the piezoelectric single crystal body 10. The upper electrode 22 is formed on the flat and smooth upper surface of the piezoelectric single crystal body 10 by patterning the conductive film into a predetermined shape. Note that a contact layer made of a metal, such as titanium (Ti) or chromium (Cr), may be formed first on the upper surface of the piezoelectric single crystal body 10, and then the conductive film may be formed on the contact layer. Here, as an option, the piezoelectric device may be patterned into a desired shape by partially removing the active layer 43 of the SOI-based substrate, the amorphous layer 30, and the piezoelectric single crystal body 10 by etching or the like.

Subsequently, the recess 141, which is illustrated in FIG. 2, is formed from a portion of a lower surface of handle layer of the SOI-based substrate toward the lower surface of the piezoelectric single crystal body 10 by deep reactive-ion etching (Deep RIE) or the like. The SOI-based substrate may be further etched so as to expose the lower surface of the buried oxide film 42 from the bottom 142 of the recess 141, or further etched so as to expose the lower surface of the active layer 43, or further etched so as to expose the amorphous layer 30. Alternatively, the SOI-based substrate and the amorphous layer 30 may be further etched so as to expose the piezoelectric single crystal body 10 and the lower electrode 21. It is preferable to set the depth of the recess 141 to be such that when the flexural vibrating diaphragm flexurally vibrates, the neutral plane of the flexural vibrating diaphragm is present outside the piezoelectric single crystal body 10. The piezoelectric device according to the first preferred embodiment can be obtained by using, for example, a manufacturing method including the steps described above.

Figure 10:
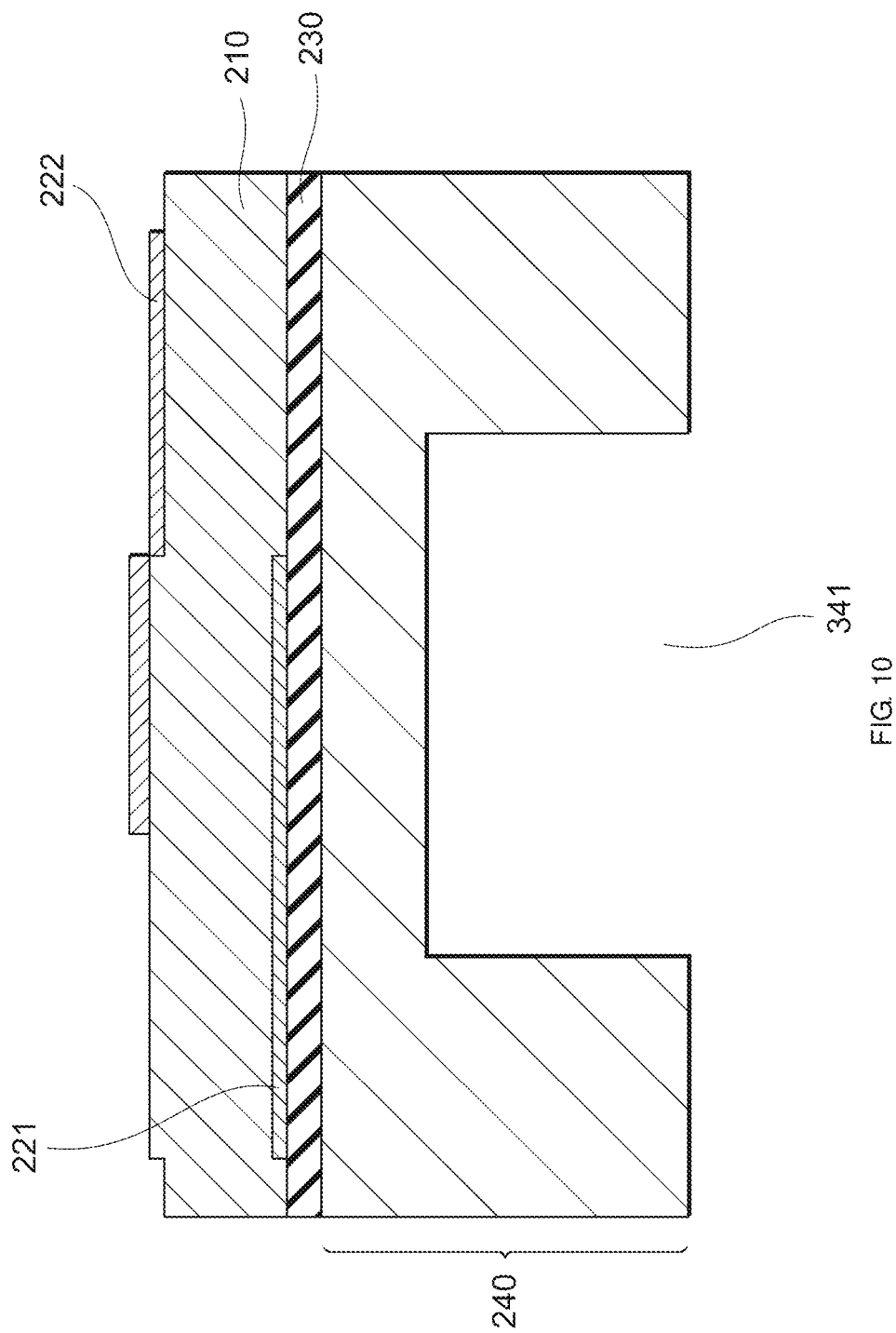
FIG. 10 is a schematic cross-sectional view illustrating a known piezoelectric device.

According to a known method of manufacturing a piezoelectric device having a flexural vibrating diaphragm, as illustrated in FIG. 10, an amorphous film 230 is first formed on a supporting substrate 240 and a lower electrode 221 is formed on the amorphous film 230. Subsequently, a piezoelectric film 210 made of, for example, aluminum nitride (AlN) or titanate zirconate (PZT) is formed by using a method, such as vapor evaporation, sputtering, laser ablation, or chemical vapor deposition (CVD), and then an upper electrode 222 is formed on the piezoelectric film 210. The recess 341 is subsequently formed in the supporting substrate 240. In this process, a step or a tapered structure is formed on the piezoelectric film 210 at an end portion of the lower electrode 221. Moreover, the polarization (orientation) state of the piezoelectric film 210 may become different between a portion of the piezoelectric film 210 having the lower electrode 221 therebelow and a portion thereof not having the lower electrode 221.

In the known piezoelectric device illustrated in FIG. 10, the quality of the piezoelectric film 210 may become inhomogeneous, which may lead to unstable vibration characteristics when the piezoelectric film 210 flexurally vibrates. When the quality of the piezoelectric film 210 is not homogeneous, a stress distribution may be generated within the piezoelectric film 210, which may cause cracks to occur in the piezoelectric film 210. The step and the tapered structure formed on the piezoelectric film 210 may generate a stress distribution, which may cause cracks to occur in the piezoelectric film 210. Moreover, it is necessary to subject the piezoelectric film 210 to poling treatment after the lower electrode 221 is formed. This may generate a stress distribution in grain boundaries and may cause cracks and leaks.

On the other hand, in the piezoelectric device according to the first preferred embodiment of the present invention illustrated in FIGS. 1 to 3, the step or the tapered structure is not formed on the piezoelectric single crystal body 10. The polarization (orientation) state is the same between the portion of the piezoelectric single crystal body 10 including the lower electrode 21 below and the portion not including the lower electrode 21. Accordingly, in the piezoelectric device according to the first preferred embodiment, the quality of the piezoelectric single crystal body 10 is homogeneous, which can provide stable vibration characteristics when the flexural vibrating diaphragm flexurally vibrates. In addition, the piezoelectric single crystal body 10 has the homogeneous quality and does not have the step or the tapered structure thereon, which reduces the likelihood of a stress distribution being generated in the piezoelectric single crystal body 10 and thus reduces the likelihood of cracks occurring therein. Moreover, the piezoelectric single crystal body 15 has already been subjected to poling treatment when the upper electrode 22 and the lower electrode 21 are formed. Therefore, it is not necessary to perform poling treatment of the piezoelectric single crystal body 15 after the upper electrode 22 and the lower electrode 21 are formed. Since grain boundaries are not present, stresses are not generated at the grain boundaries. Thus, according to the first preferred embodiment, a reliable piezoelectric device and a method of manufacturing the reliable piezoelectric device are provided.

Note that in the case of the amorphous layer 30 being made of a heat-insulating material in the piezoelectric device according to the first preferred embodiment, thermal conduction from the supporting substrate 40 to the piezoelectric single crystal body 10 is reduced or prevented, which reduces or prevents noise generation due to pyroelectric effect.

Second Preferred Embodiment

Figure 11:
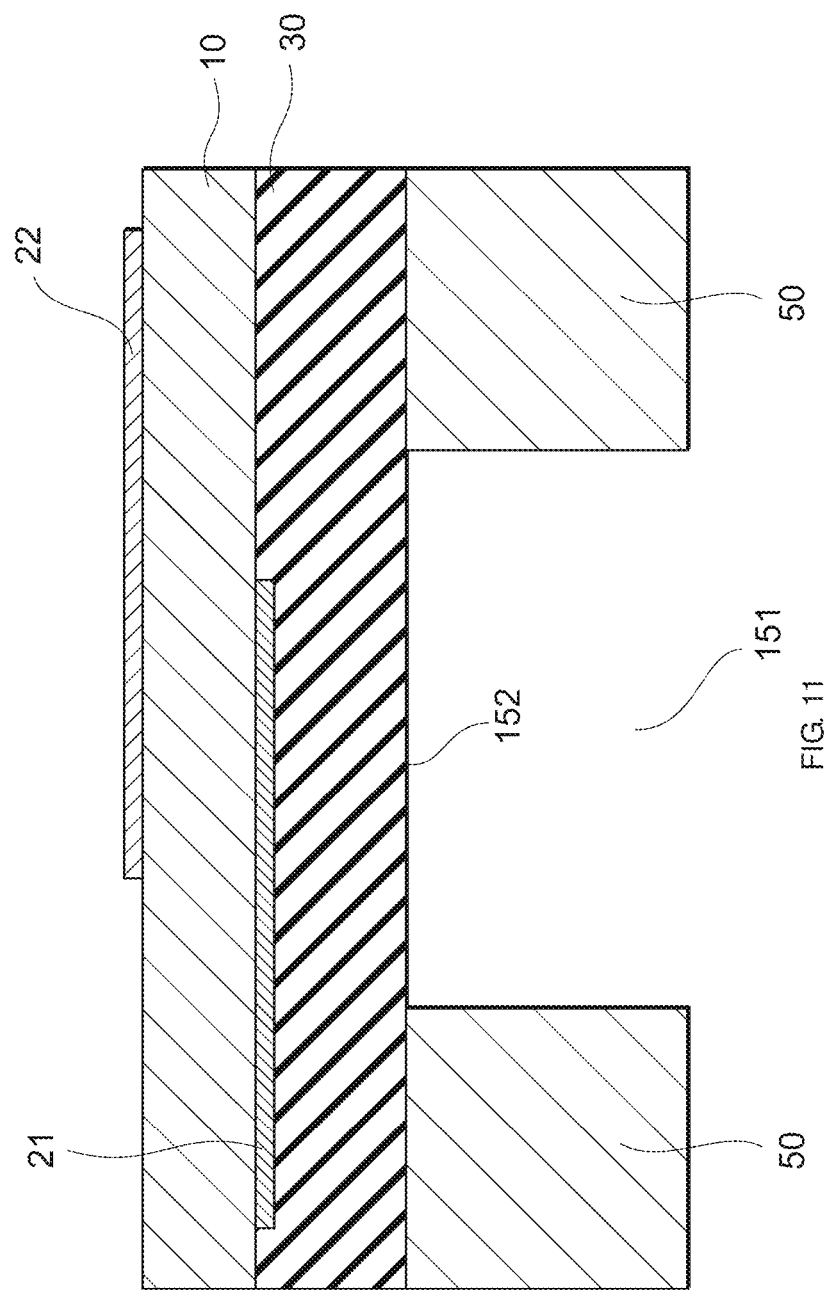
FIG. 11 is a schematic cross-sectional view illustrating a piezoelectric device according to a second preferred embodiment of the present invention.

A second preferred embodiment of the present invention will be described by focusing on points different from those of the first preferred embodiment, and the description of points common to the first and the other preferred embodiments will be omitted. Advantageous effects obtained by a similar configuration will not be described repeatedly for each preferred embodiment of the prevent invention. As illustrated in FIG. 11, a piezoelectric device according to the second preferred embodiment includes a supporting substrate 50 that is a silicon substrate. The piezoelectric device according to the second preferred embodiment includes a recess 151 that extends from the lower surface of the supporting substrate 50 toward the lower surface of the piezoelectric single crystal body 10. The amorphous layer 30 is exposed at a bottom 152 of the recess 151.

Also in the second preferred embodiment, when a voltage is applied to the piezoelectric single crystal body 10 between the upper electrode 22 and the lower electrode 21, the piezoelectric single crystal body 10 tries to expand or contract in an in-plane direction while the upper electrode 22, the lower electrode 21, and the amorphous layer 30 do not expand nor contract. As a result, the flexural vibrating diaphragm flexurally vibrates up and down. The thickness of the amorphous layer 30 is preferably set to be such that when the flexural vibrating diaphragm flexurally vibrates, the neutral plane of the flexural vibrating diaphragm is present inside the amorphous layer 30 and outside the piezoelectric single crystal body 10.

Next, a non-limiting example of a method of manufacturing the piezoelectric device according to the second preferred embodiment will be described.

Figure 12:
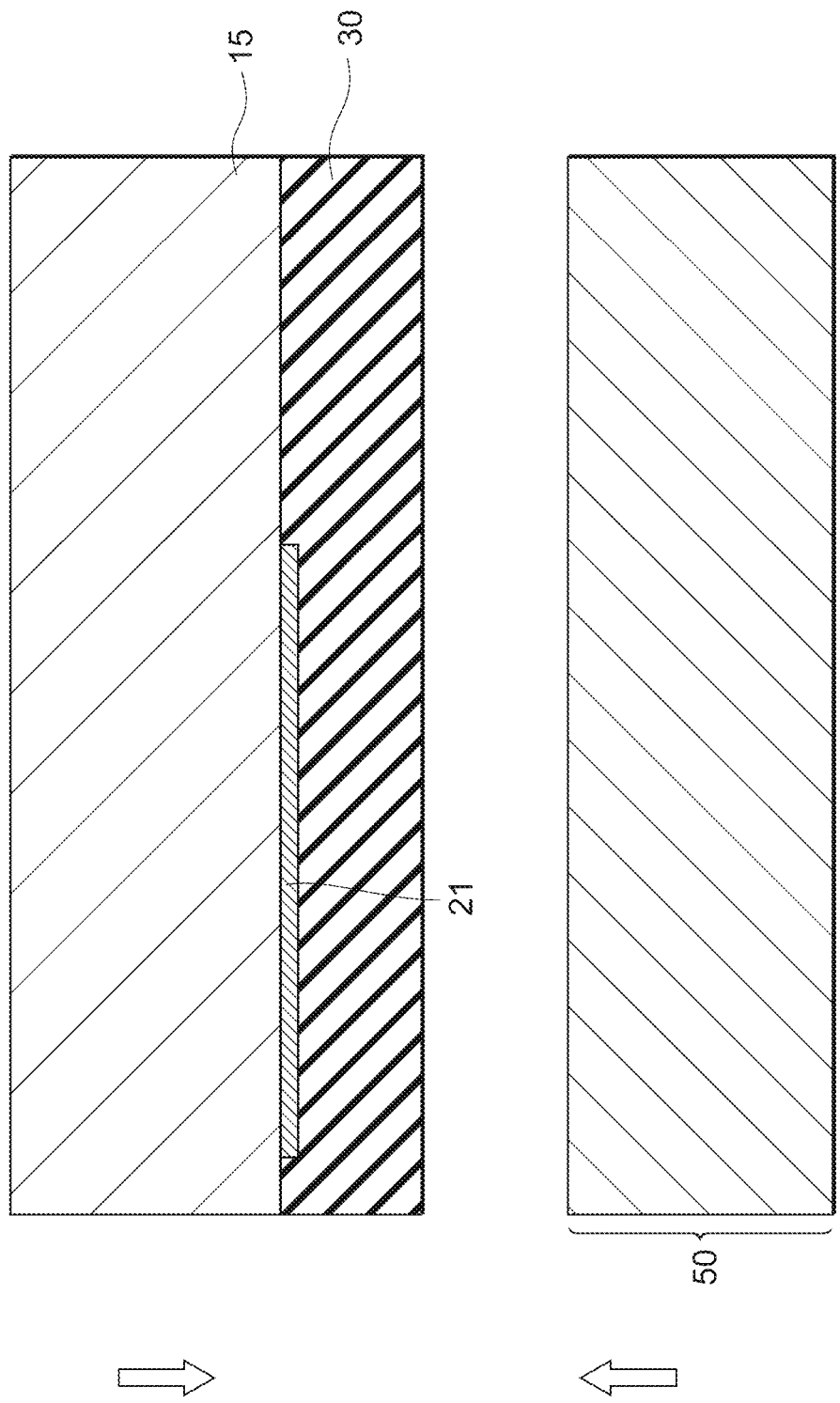
FIG. 12 is a schematic cross-sectional view for explanation of a method of manufacturing the piezoelectric device according to the second preferred embodiment of the present invention.
Figure 13:
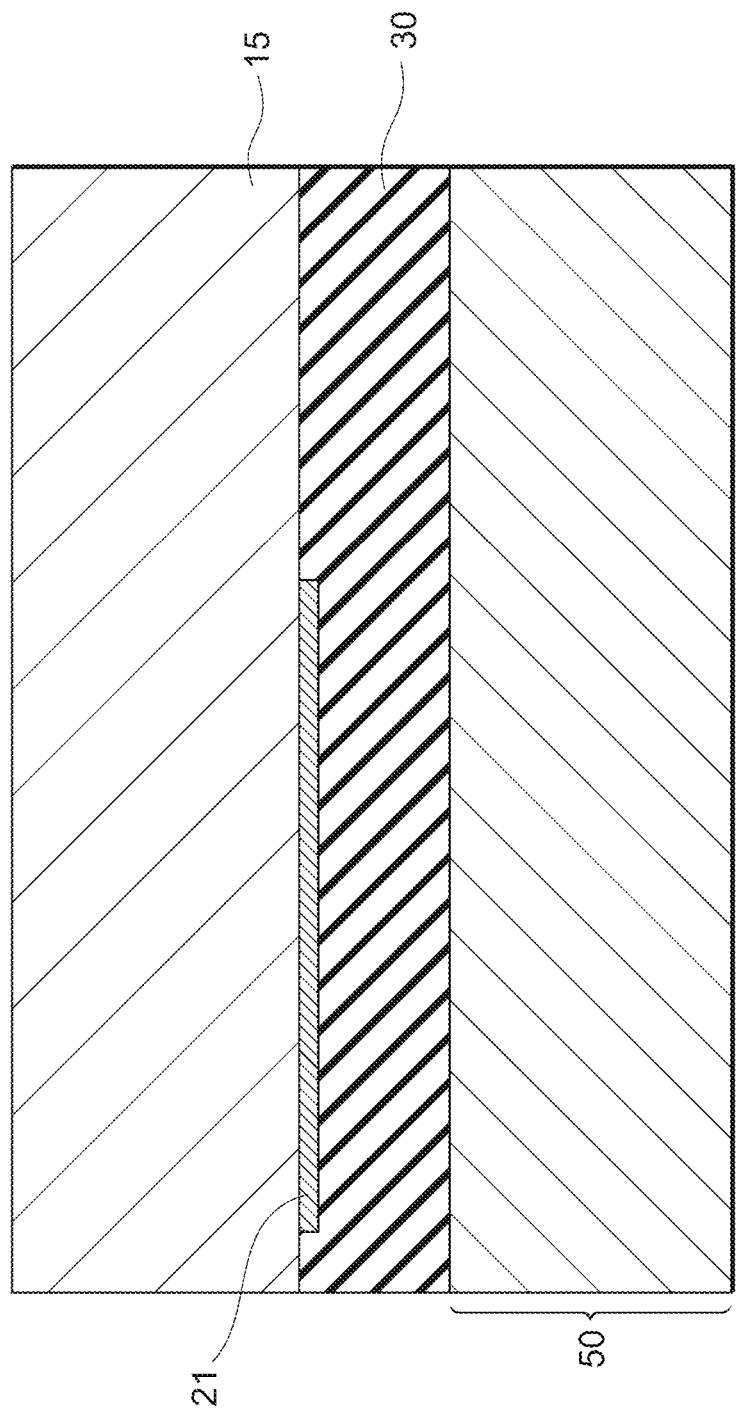
FIG. 13 is another schematic cross-sectional view for explanation of the method of manufacturing the piezoelectric device according to the second preferred embodiment of the present invention.
Figure 14:
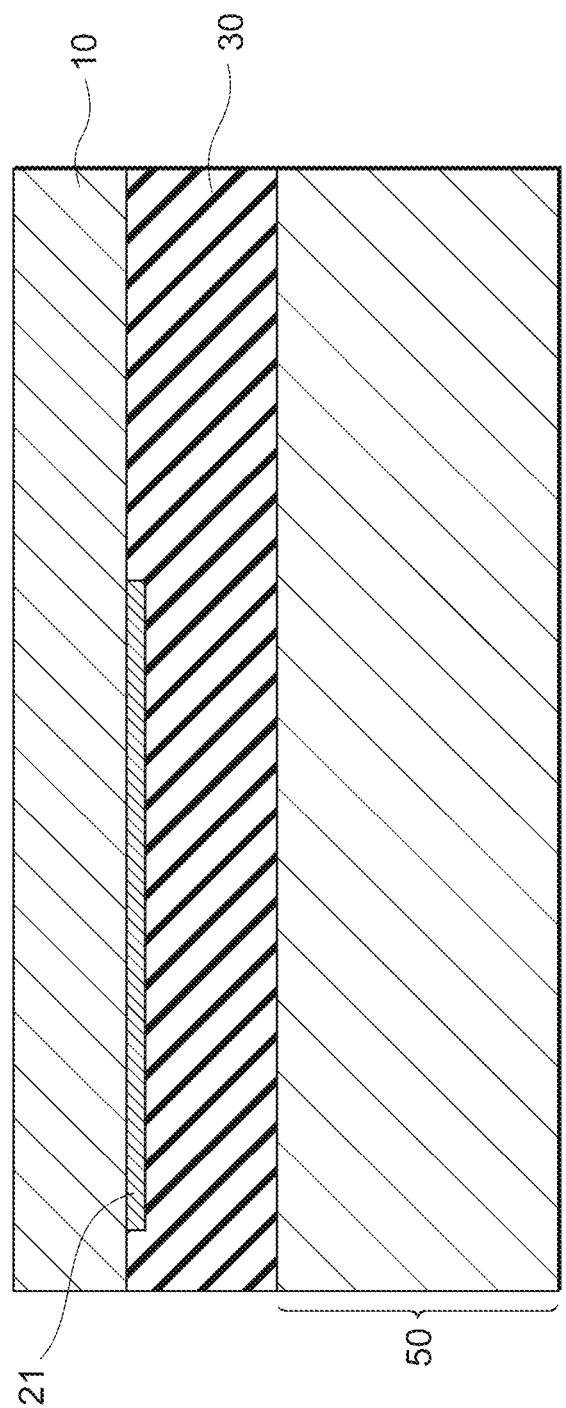
FIG. 14 is another schematic cross-sectional view for explanation of the method of manufacturing the piezoelectric device according to the second preferred embodiment of the present invention.

As illustrated in FIG. 12, similarly to the first preferred embodiment, the lower electrode 21 is formed on the lower surface of the substrate-shaped piezoelectric single crystal body 15, and the amorphous layer 30 is formed on the lower surface of the piezoelectric single crystal body 15 and also on the lower surface of the lower electrode 21. A silicon substrate that defines the supporting substrate 50 is prepared. Next, as illustrated in FIG. 13, the upper surface of the silicon substrate and the lower surface of the amorphous layer 30 are directly joined to each other. Subsequently, as illustrated in FIG. 14, the substrate-shaped piezoelectric single crystal body 15 is polished from the upper surface thereof to reduce the thickness and obtain a film shape.

Figure 15:
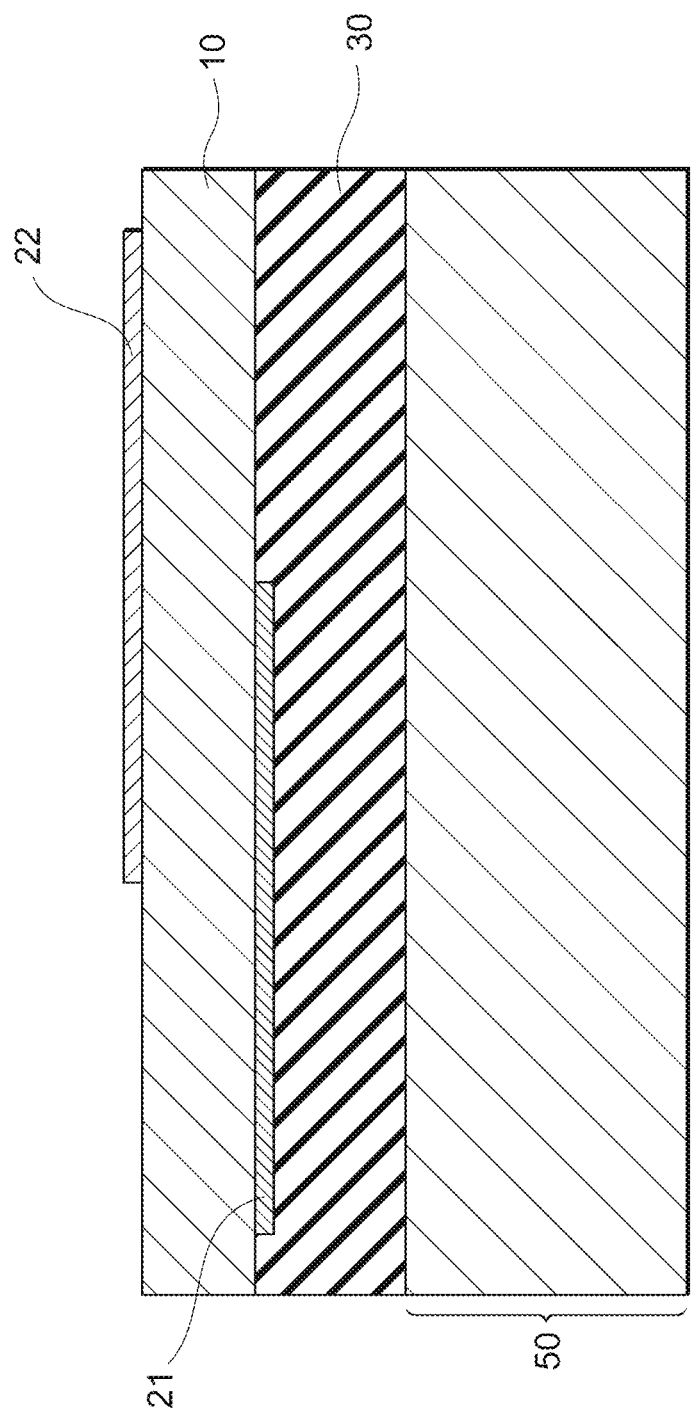
FIG. 15 is another schematic cross-sectional view for explanation of the method of manufacturing the piezoelectric device according to the second preferred embodiment of the present invention.

As illustrated in FIG. 15, the upper electrode 22 is formed on the upper surface of the piezoelectric single crystal body 10. Subsequently, the recess 151 including the bottom 152 where the lower surface of the amorphous layer 30 is exposed as illustrated in FIG. 11 is formed from a portion of a lower surface of the silicon substrate toward the lower surface of the piezoelectric single crystal body 10 by using Deep RIE or the like. The piezoelectric device according to the second preferred embodiment can be thus obtained by using, for example, a manufacturing method including the steps described above. Note that when the amorphous layer 30 is formed, the thickness of the amorphous layer 30 may be set so as to enable the flexural vibrating diaphragm, which will be formed later, to flexurally vibrate. Alternatively, when the recess 151 is formed, the thickness of the amorphous layer 30 may be set so as to enable the flexural vibrating diaphragm to flexurally vibrate.

Third Preferred Embodiment

Figure 16:
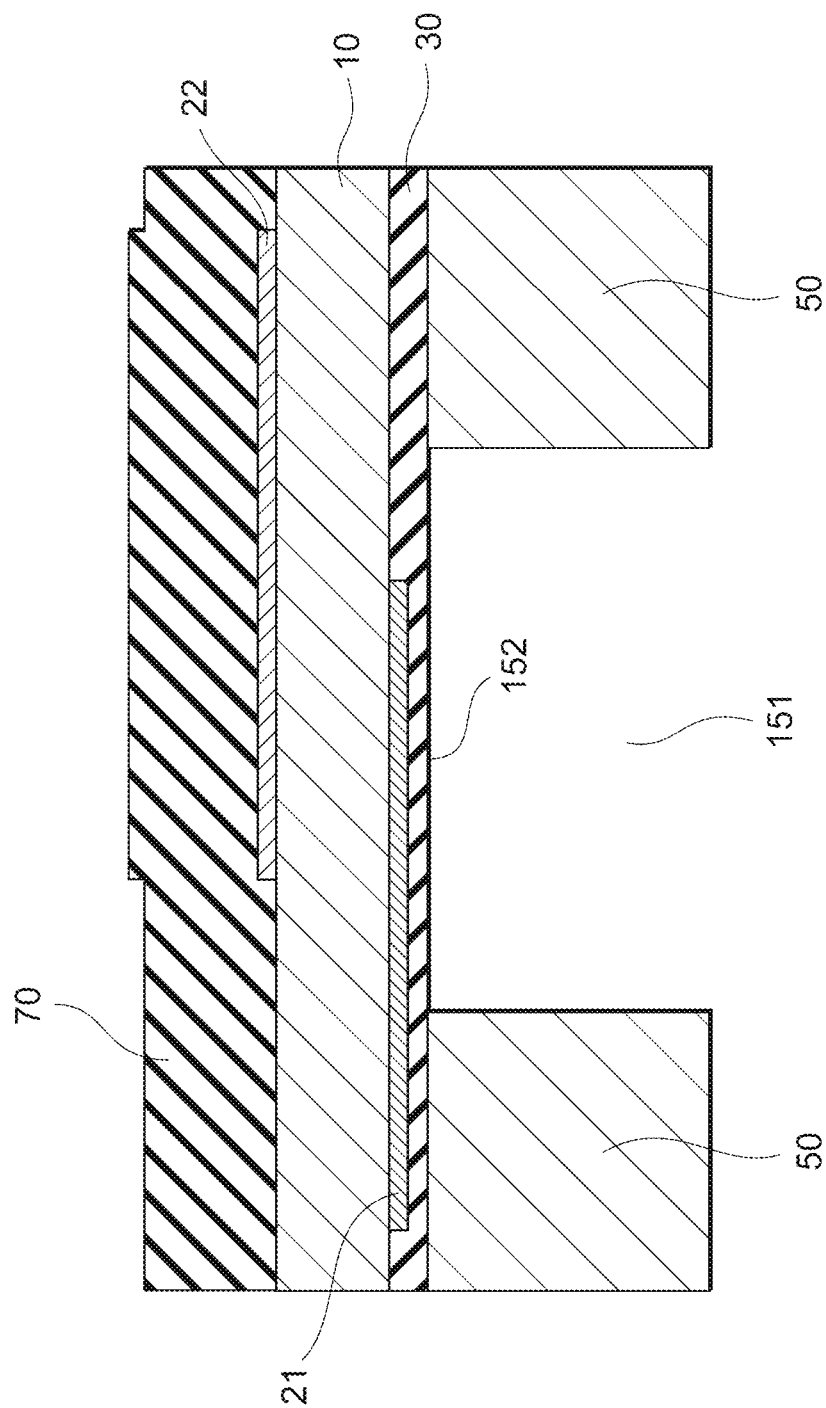
FIG. 16 is a schematic cross-sectional view illustrating a piezoelectric device according to a third preferred embodiment of the present invention.

As illustrated in FIG. 16, a piezoelectric device according to a third preferred embodiment of the present invention may further include a supporting film 70 that covers the upper surface of the piezoelectric single crystal body 10 and the upper electrode 22. The supporting film 70 may be made of a material, such as polysilicon, silicon nitride, or aluminum nitride. In the third preferred embodiment, the supporting film 70 defines and functions as part of the flexural vibrating diaphragm. The supporting film 70 covers the upper surface of the piezoelectric single crystal body 10, which enables the supporting film 70 to function also as a protective film against outside air.

In the third preferred embodiment, when a voltage is applied to the piezoelectric single crystal body 10 between the upper electrode 22 and the lower electrode 21, the piezoelectric single crystal body 10 tries to expand or contract in an in-plane direction while the supporting film 70, the upper electrode 22, the lower electrode 21, and the amorphous layer 30 do not expand nor contract. As a result, the flexural vibrating diaphragm flexurally vibrates up and down. The thickness of the supporting film 70 is preferably set to be such that when the flexural vibrating diaphragm flexurally vibrates, the neutral plane of the flexural vibrating diaphragm is present inside the supporting film 70 and outside the piezoelectric single crystal body 10.

Next, a non-limiting example of a method of manufacturing the piezoelectric device according to the third preferred embodiment will be described.

Figure 17:
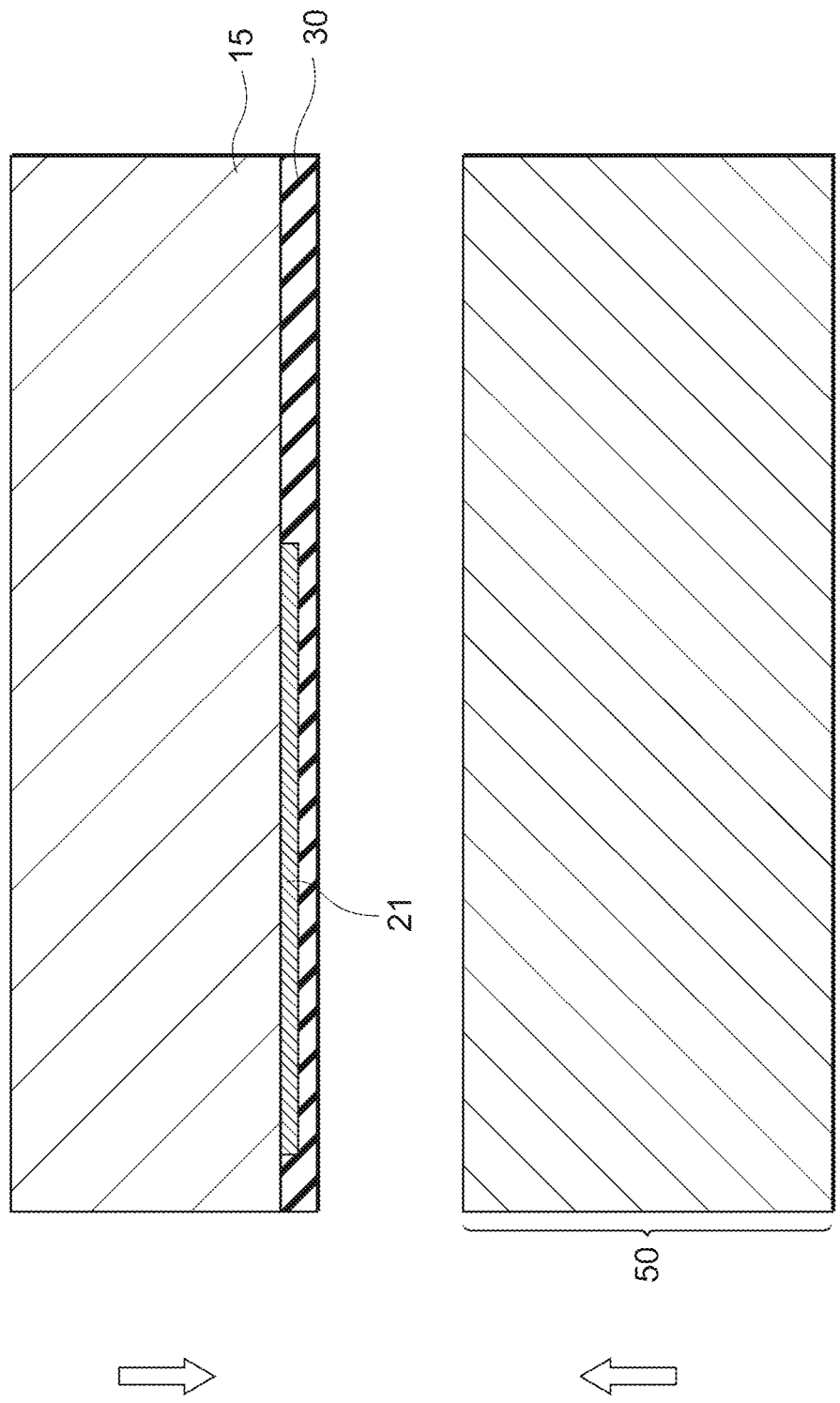
FIG. 17 is a schematic cross-sectional view for explanation of a method of manufacturing the piezoelectric device according to the third preferred embodiment of the present invention.
Figure 18:
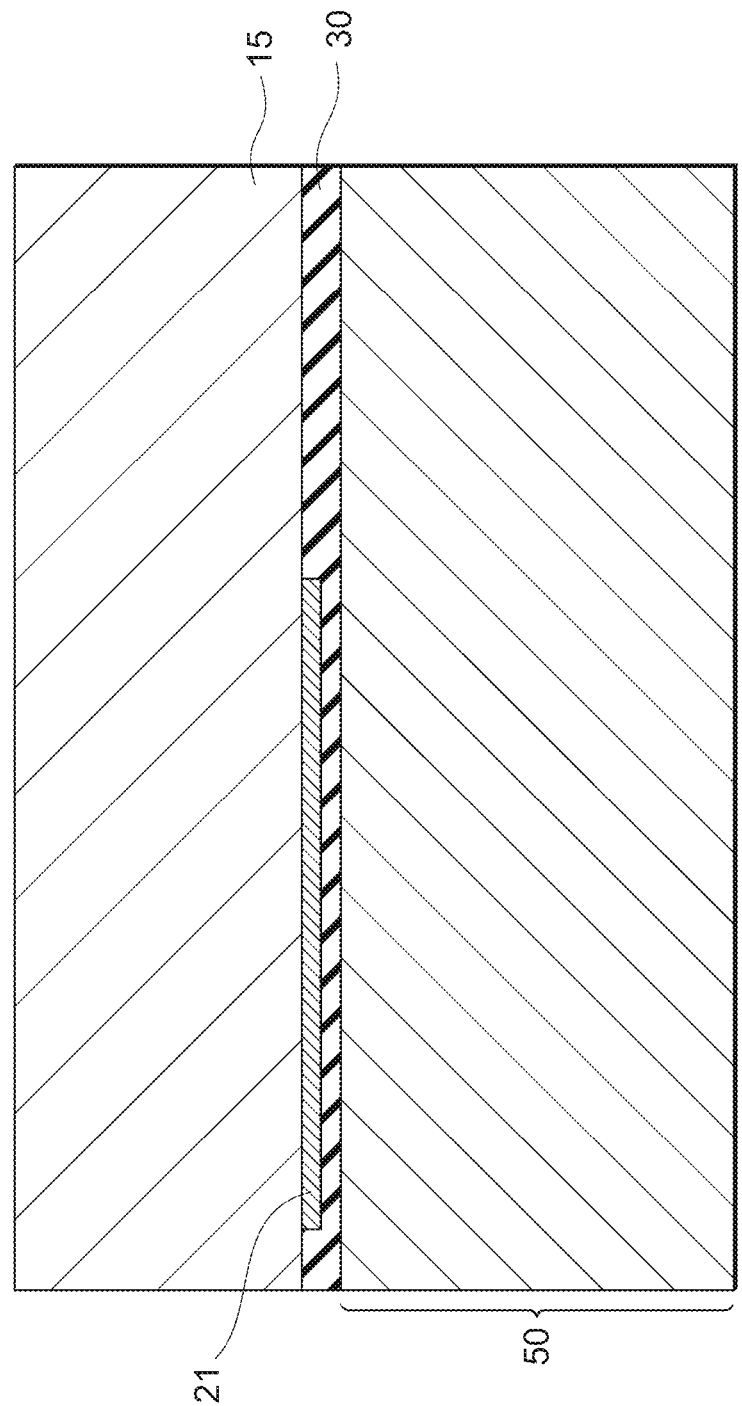
FIG. 18 is another schematic cross-sectional view for explanation of the method of manufacturing the piezoelectric device according to the third preferred embodiment of the present invention.
Figure 19:
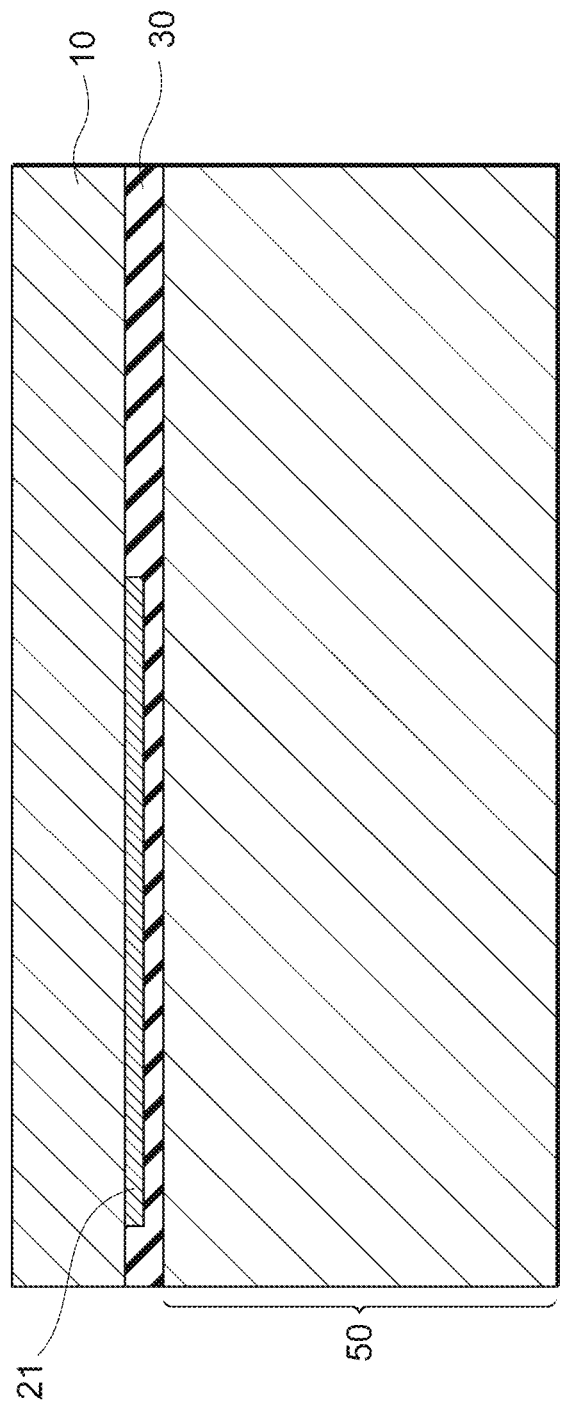
FIG. 19 is another schematic cross-sectional view for explanation of the method of manufacturing the piezoelectric device according to the third preferred embodiment of the present invention.

As illustrated in FIG. 17, similarly to the first preferred embodiment, the lower electrode 21 is formed on the lower surface of the substrate-shaped piezoelectric single crystal body 15, and the amorphous layer 30 is further formed on the lower surface of the piezoelectric single crystal body 15 and also on the lower surface of the lower electrode 21. A silicon substrate that defines the supporting substrate 50 is prepared. Next, as illustrated in FIG. 18, the upper surface of the silicon substrate and the lower surface of the amorphous layer 30 are directly joined to each other. Subsequently, as illustrated in FIG. 19, the substrate-shaped piezoelectric single crystal body 15 is polished from the upper surface thereof to reduce the thickness and obtain a film shape.

Figure 20:
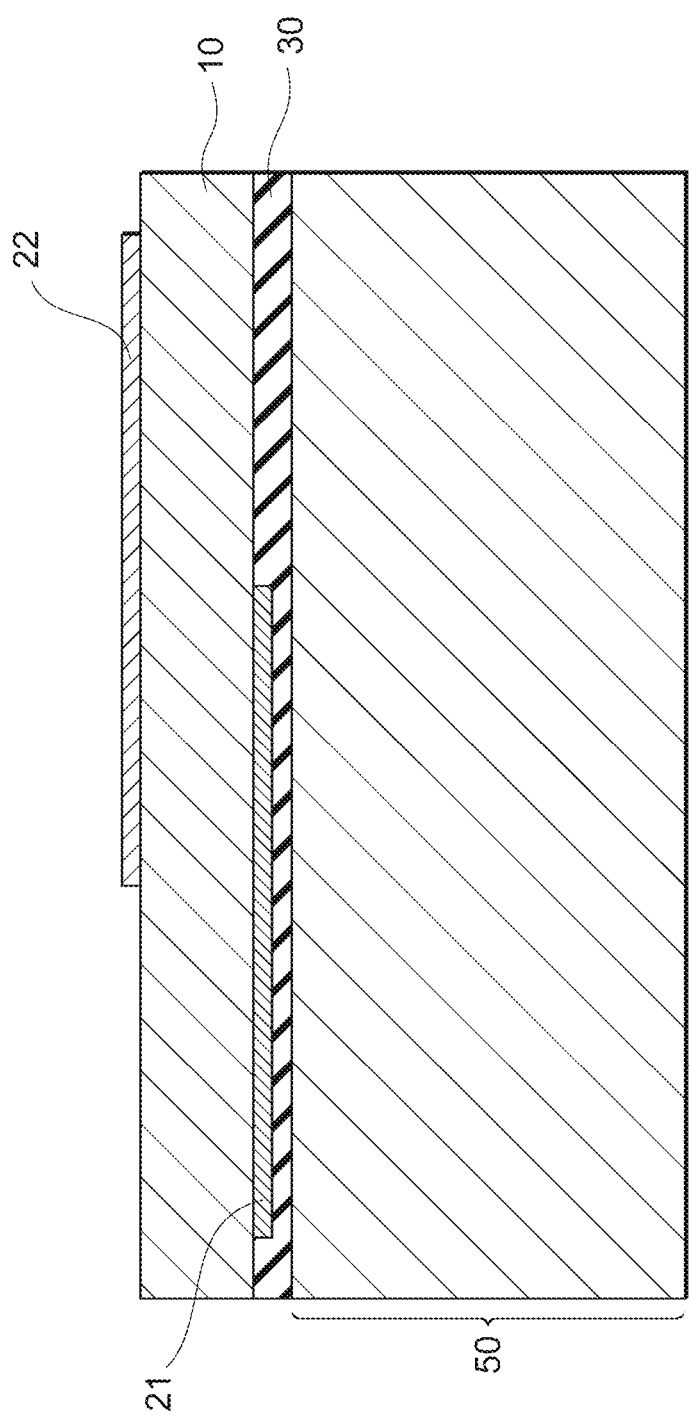
FIG. 20 is another schematic cross-sectional view for explanation of the method of manufacturing the piezoelectric device according to the third preferred embodiment of the present invention.

As illustrated in FIG. 20, the upper electrode 22 is formed on the upper surface of the piezoelectric single crystal body 10. Next, as illustrated in FIG. 21, the supporting film 70 that covers the upper surface of the piezoelectric single crystal body 10 and the upper electrode 22 is formed. Here, as an option, the piezoelectric device may be patterned into a desired shape by partially removing the amorphous layer 30, the piezoelectric single crystal body 10, and the supporting film 70 by etching or the like. Subsequently, the recess 151 including the bottom 152 where the lower surface of the amorphous layer 30 is exposed as illustrated in FIG. 16 is formed from a portion of a lower surface of the silicon substrate toward the lower surface of the piezoelectric single crystal body 10 by using Deep RIE or the like. Note that the lower electrode 21 and the lower surface of the piezoelectric single crystal body 10 may be exposed at the bottom of the recess 151 by further removing a portion of the amorphous layer 30.

According to the method of manufacturing the piezoelectric device according to the third preferred embodiment, the supporting film 70 is formed after the supporting substrate 50 is joined to the amorphous layer 30 and the piezoelectric single crystal body 15 is polished. This enables the piezoelectric device to be manufactured more easily. In addition, the thickness of the supporting film 70 can be adjusted based on the results of polishing the piezoelectric single crystal body 15.

The piezoelectric devices and the methods of manufacturing the piezoelectric devices according to each preferred embodiment of the present invention have configurations and advantageous effects as described below by way of example, which are based on one, or a combination, of the above-described features.

Each of the piezoelectric devices according to the preferred embodiments includes a piezoelectric single crystal body 10 that has a homogeneous polarization state and of which at least a portion is configured to flexurally vibrate, an upper electrode 22 disposed on an upper surface of the piezoelectric single crystal body 10, a lower electrode 21 disposed on a lower surface of the piezoelectric single crystal body 10, and a supporting substrate 40 disposed below the piezoelectric single crystal body 10. In the piezoelectric device, a recess 141 extends from a lower surface of the supporting substrate 40 toward the lower surface of the piezoelectric single crystal body 10.

In each of the piezoelectric devices according to the preferred embodiments, the piezoelectric single crystal body 10 has a homogeneous polarization state and does not have grain boundaries, which reduces the likelihood of a stress distribution being generated in the piezoelectric single crystal body 10 and reduces the likelihood of cracks and leaks occurring therein.

In the piezoelectric device, the piezoelectric single crystal body 10 may include a plurality of layers, and the plurality of layers may include an upper layer and a lower layer. The upper electrode 22 may be disposed on an upper surface of upper layer of the piezoelectric single crystal body, and the lower electrode 21 may be disposed on a lower surface of lower layer of the piezoelectric single crystal body. Each of the upper layer and the lower layer of the piezoelectric single crystal body may have a homogeneous polarization state.

With this configuration, the piezoelectric device is enabled to provide a large displacement in flexural vibrations because of the bimorph structure.

In the piezoelectric device, the lower surface of the piezoelectric single crystal body 10 may be flat, and the lower electrode 21 may be disposed on the flat lower surface of the piezoelectric single crystal body 10.

With this configuration, the piezoelectric single crystal body 10 does not have a step or a tapered structure thereon, which reduces the likelihood of a stress distribution being generated in the piezoelectric single crystal body 10 and reduces the likelihood of cracks and leaks occurring therein.

In the piezoelectric device, an amorphous layer 30 may be disposed above the supporting substrate 40 and below the piezoelectric single crystal body 10. The amorphous layer 30 may be made of a heat-insulating material. The piezoelectric device may have the supporting substrate 40 disposed below the amorphous layer 30. In the piezoelectric device, the recess 141 may extend from a lower surface of the supporting substrate 40 toward the lower surface of the piezoelectric single crystal body 10.

In the case of the amorphous layer 30 being made of a heat-insulating material, thermal conduction from the supporting substrate 40 to the piezoelectric single crystal body 10 is able to be reduced or prevented, which reduces or prevents noise generation due to pyroelectric effect.

In the piezoelectric device, the supporting substrate 40 may be an SOI-based substrate that includes a handle layer 41, a buried oxide film 42 disposed on the handle layer 41, and an active layer 43 disposed on the buried oxide film 42. In addition, an upper surface of active layer 43 of the SOI-based substrate and a lower surface of the amorphous layer 30 may be joined to each other.

In the piezoelectric device, the buried oxide film 42 of the SOI-based substrate may be exposed at a bottom 142 of the recess 141, or alternatively the active layer 43 of the SOI-based substrate may be exposed at the bottom 142 of the recess 141.

With this configuration, when the piezoelectric devices according to the preferred embodiments are manufactured, the buried oxide film 42 or the active layer 43 can be utilized as an etch-stop layer.

In the piezoelectric device, the amorphous layer 30 may be exposed at the bottom of the recess 151, or alternatively the lower surface of the piezoelectric single crystal body 10 and the lower electrode 21 may be exposed at the bottom of the recess 151. The supporting substrate 50 may be a silicon substrate.

With this configuration, the structural simplicity improves the reliability of the piezoelectric device and reduces the manufacturing cost and improves yields.

The piezoelectric device may further include a supporting film 70 disposed on the upper surface of the piezoelectric single crystal body 10 and on the upper electrode 22.

With this configuration, the piezoelectric single crystal body 10 is protected from outside air.

According to the preferred embodiments, methods of manufacturing piezoelectric devices in each of which at least a portion of the piezoelectric single crystal body is configured to flexurally vibrate includes preparing a piezoelectric single crystal body 15 with a homogeneous polarization state, forming a lower electrode 21 on a lower surface of the piezoelectric single crystal body 15, forming an upper electrode 22 on an upper surface of the piezoelectric single crystal body 10, disposing a supporting substrate 40 below the piezoelectric single crystal body 10, and forming a recess 141 that extends from a lower surface of the supporting substrate 40 toward the lower surface of the piezoelectric single crystal body 10.

With this configuration, the piezoelectric single crystal body 15 has already been subjected to poling treatment when the upper electrode 22 and the lower electrode 21 are formed. Therefore, it is not necessary to perform poling treatment of the piezoelectric single crystal body 15 after the upper electrode 22 and the lower electrode 21 are formed. In addition, in the piezoelectric devices manufactured by using the methods according to the preferred embodiments, the piezoelectric single crystal body 10 does not have grain boundaries, which reduces the likelihood of a stress distribution being generated in the piezoelectric single crystal body 10 and reduces the likelihood of cracks and leaks occurring therein.

In the methods of manufacturing the piezoelectric devices, the piezoelectric single crystal body 10 may include a plurality of layers, and the plurality of layers may include an upper layer and a lower layer. The lower electrode 21 may be formed on a lower surface of lower layer of the piezoelectric single crystal body, and the upper electrode 22 may be formed on an upper surface of upper layer of the piezoelectric single crystal body. Each of the upper layer and the lower layer of the piezoelectric single crystal body may have a homogeneous polarization state.

With this configuration, the piezoelectric device having the bimorph structure can be manufactured, and the piezoelectric device manufactured is enabled to provide a large displacement in flexural vibrations.

In the methods of manufacturing the piezoelectric devices, the lower electrode 21 may be formed on a flat lower surface of the piezoelectric single crystal body 15.

With this configuration, the piezoelectric single crystal body 15 does not have a step or a tapered structure thereon, which reduces the likelihood of a stress distribution being generated in the piezoelectric single crystal body 10 and reduces the likelihood of cracks and leaks occurring therein.

The methods of manufacturing the piezoelectric devices may further include forming an amorphous layer 30 above the supporting substrate 40 and below the piezoelectric single crystal body 15. The amorphous layer 30 may be made of a heat-insulating material. The methods of manufacturing the piezoelectric devices may further include joining a lower surface of the amorphous layer 30 and an upper surface of the supporting substrate 40 to each other.

With this configuration, in the piezoelectric devices manufactured, thermal conduction from the supporting substrate 40 to the piezoelectric single crystal body 10 is able to reduced or prevented, which reduces or prevents noise generation due to pyroelectric effect.

In the methods of manufacturing the piezoelectric devices, the supporting substrate 40 may be an SOI-based substrate that includes a handle layer 41, a buried oxide film 42 disposed on the handle layer 41, and an active layer 43 disposed on the buried oxide film 42. In addition, in the step of joining, an upper surface of active layer 43 of the SOI-based substrate and a lower surface of the amorphous layer 30 may be joined to each other.

The methods of manufacturing the piezoelectric devices may further include forming a recess 141 that extends from a lower surface of the supporting substrate 40 toward the lower surface of the piezoelectric single crystal body 15. In addition, in the step of forming the recess 141, the buried oxide film 42 of the SOI-based substrate may be exposed at a bottom 142 of the recess 141, or alternatively, the active layer 43 of the SOI-based substrate may be exposed at the bottom 142 of the recess 141.

With this configuration, the buried oxide film 42 or the active layer 43 is able to be utilized as an etch-stop layer.

The methods of manufacturing the piezoelectric devices may further include forming a recess 141 that extends from a lower surface of the supporting substrate 40 toward the lower surface of the piezoelectric single crystal body 15. In addition, in the step of forming the recess 151, the amorphous layer 30 may be exposed at a bottom 152 of a recess 151, or alternatively, the lower surface of the piezoelectric single crystal body 10 and the lower electrode 21 may be exposed at the bottom 152 of the recess 151. The supporting substrate 50 may be a silicon substrate.

With this configuration, the manufacturing cost is reduced and yields are improved.

The methods of manufacturing the piezoelectric devices may further include forming a supporting film 70 on the upper surface of the piezoelectric single crystal body 10 and on the upper electrode 22.

With this configuration, the supporting film 70 is formed after the amorphous layer 30 is joined to the supporting substrate 50 and the piezoelectric single crystal body 15 is polished. This enables the piezoelectric device to be manufactured more easily. In addition, the thickness of the supporting film 70 can be adjusted based on the results of polishing the piezoelectric single crystal body 15.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a piezoelectric single crystal body that has a homogeneous polarization state and of which at least a portion is configured to flexurally vibrate;
   an upper electrode disposed on an upper surface of the piezoelectric single crystal body;
   a lower electrode disposed on a lower surface of the piezoelectric single crystal body; and
   a supporting substrate disposed below the piezoelectric single crystal body; wherein
   a recess extends from a lower surface of the supporting substrate toward the lower surface of the piezoelectric single crystal body; and
   a space at a side of the piezoelectric single crystal body is exposed to the recess.

2. The piezoelectric device according to claim 1, wherein the piezoelectric single crystal body includes a plurality of layers including an upper layer and a lower layer;
   the upper electrode is disposed on an upper surface of upper layer of the piezoelectric single crystal body;
   the lower electrode is disposed on a lower surface of lower layer of the piezoelectric single crystal body; and
   each of the upper layer and the lower layer of the piezoelectric single crystal body has a homogeneous polarization state.

3. The piezoelectric device according to claim 1, wherein the lower surface of the piezoelectric single crystal body is flat, and the lower electrode is disposed on the flat lower surface of the piezoelectric single crystal body.

4. The piezoelectric device according to claim 1, further comprising:
an amorphous layer disposed above the supporting substrate and below the piezoelectric single crystal body.

5. The piezoelectric device according to claim 4, wherein the amorphous layer is made of a heat-insulating material.

6. The piezoelectric device according to claim 4, wherein
the supporting substrate is a silicon-on-insulator based substrate that includes a handle layer, a buried oxide film disposed on the handle layer, and an active layer disposed on the buried oxide film; and
an upper surface of active layer of the silicon-on-insulator based substrate and a lower surface of the amorphous layer are joined to each other.

7. The piezoelectric device according to claim 6, wherein the buried oxide film of the silicon-on-insulator based substrate is exposed at a bottom of the recess.

8. The piezoelectric device according to claim 6, wherein the active layer of the silicon-on-insulator based substrate is exposed at a bottom of the recess.

9. The piezoelectric device according to claim 4, wherein the amorphous layer is exposed at a bottom of the recess.

10. The piezoelectric device according to claim 1, wherein the lower surface of the piezoelectric single crystal body and the lower electrode are exposed at a bottom of the recess.

11. The piezoelectric device according to claim 1, further comprising:
a supporting film disposed on the upper surface of the piezoelectric single crystal body and on the upper electrode.

* * * * *